United States Patent [19]

Meyer

[11] Patent Number: 5,038,248

[45] Date of Patent: Aug. 6, 1991

[54] AUTOMATIC ESD PROTECTION DEVICE FOR SEMICONDUCTOR PACKAGES

[75] Inventor: Russell L. Meyer, Melbourne, Fla.

[73] Assignee: Harris Corporation, Melbourne, Fla.

[21] Appl. No.: 447,618

[22] Filed: Dec. 8, 1989

[51] Int. Cl.⁵ .......................... H05K 1/00; H05F 1/00
[52] U.S. Cl. .................................... 361/212; 361/421; 357/70; 206/328
[58] Field of Search ....................... 361/212, 220–224, 361/380, 421, 424; 307/100; 357/70, 74; 174/5 R, 5 SB, 5 SG, 51, 52.1; 324/158 F; 206/328, 331

[56] References Cited

U.S. PATENT DOCUMENTS 4,706,161 11/1987 Buckingham ...................... 361/220
4,725,918 2/1988 Bakker ................................ 361/220

Primary Examiner—A. D. Pellinen
Assistant Examiner—David Osborn
Attorney, Agent, or Firm—Barnes & Thornburg

[57] ABSTRACT

A electrostatic discharge protecting device, to be included in a package carrier assembly, includes shorting elements for shorting the leads together in combination with biasing elements to bias the shorting elements into engagement with the leads and an actuator which is responsive to being inserted into a tester to overcome the biasing element and disengage the shorting elements from the leads and to automatically re-engage the shorting elements to the leads upon removal from the tester.

17 Claims, 1 Drawing Sheet

AUTOMATIC ESD PROTECTION DEVICE FOR SEMICONDUCTOR PACKAGES

BACKGROUND AND SUMMARY OF THE INVENTION

The present invention relates generally to electrostatic discharge protection devices for semiconductors and more specifically to shorting bar electrostatic discharge protections.

A semiconductor integrated circuit is susceptible to electrostatic discharge (ESD). Most circuits have built-in circuitry to protect them from large electrostatic discharges when the integrated circuit is mounted or installed in there end use. To protect integrated circuits from electrostatic discharge, prior to being assembled in a circuit and during shipping and, it is common practice in the industry to provide a shorting bar which extends across the leads of a semiconductor package in a package carrier to short the leads to each other. If these packages are inserted in a tester, the shorting bar is removed from the leads to allow testing. Once the packages are removed from the tester, they require manual reset. All to often, the test operator fails to reset the shorting bar, therefore the package becomes susceptible to destruction by electrostatic discharge. A typical example is part number 7-0132-10655-940-XXX-000 from 3 m Textool. Thus, there is a need for a fully automatic shorting bar mechanism to protect the semiconductor package.

Thus, it is obvious of the present invention to provide a fully automatic shorting bar mechanism for a semiconductor packages.

Further, it is the object of the present invention to provide a shorting bar assembly which is inexpensive and easy to assemble as well as fully automatic.

These and other objects are achieved by providing a shorting bar and a package carrier for a semiconductor package which includes the shorting elements and a biasing element for biasing the shorting elements into engagement with the leads. An actuator is provided for automatically overcoming the biasing and causing the shorting elements to disengage the leads in response to the package carrier being mounted to a tester and automatically resetting to allow the biasing to cause a shorting bars to engage the leads in response to package being removed from the tester. The shorting element includes a plurality of shorting elements, one for each set of leads extending from a respective side of the package and preferably is a unitary structure. The actuator and the biasing means are also formed as a unitary structure with the shorting elements. The actuator extends from the shorting elements and into a first opening in a first wall of the housing allowing it to be responsive to its position relative to the tester. The biasing element extends from the end of the actuator to a second wall of the housing for biasing the actuator to extend into the first opening and the shorting elements onto the leads. The second wall also has a second opening into which the shorting elements extend when disengaged from the leads.

Other objects, advantages and novel features of the present invention will become apparent from the following detailed description of the invention when considered in conjunction with the accompanying drawings.

DETAILED DESCRIPTION OF THE DRAWINGS

Figure 1:
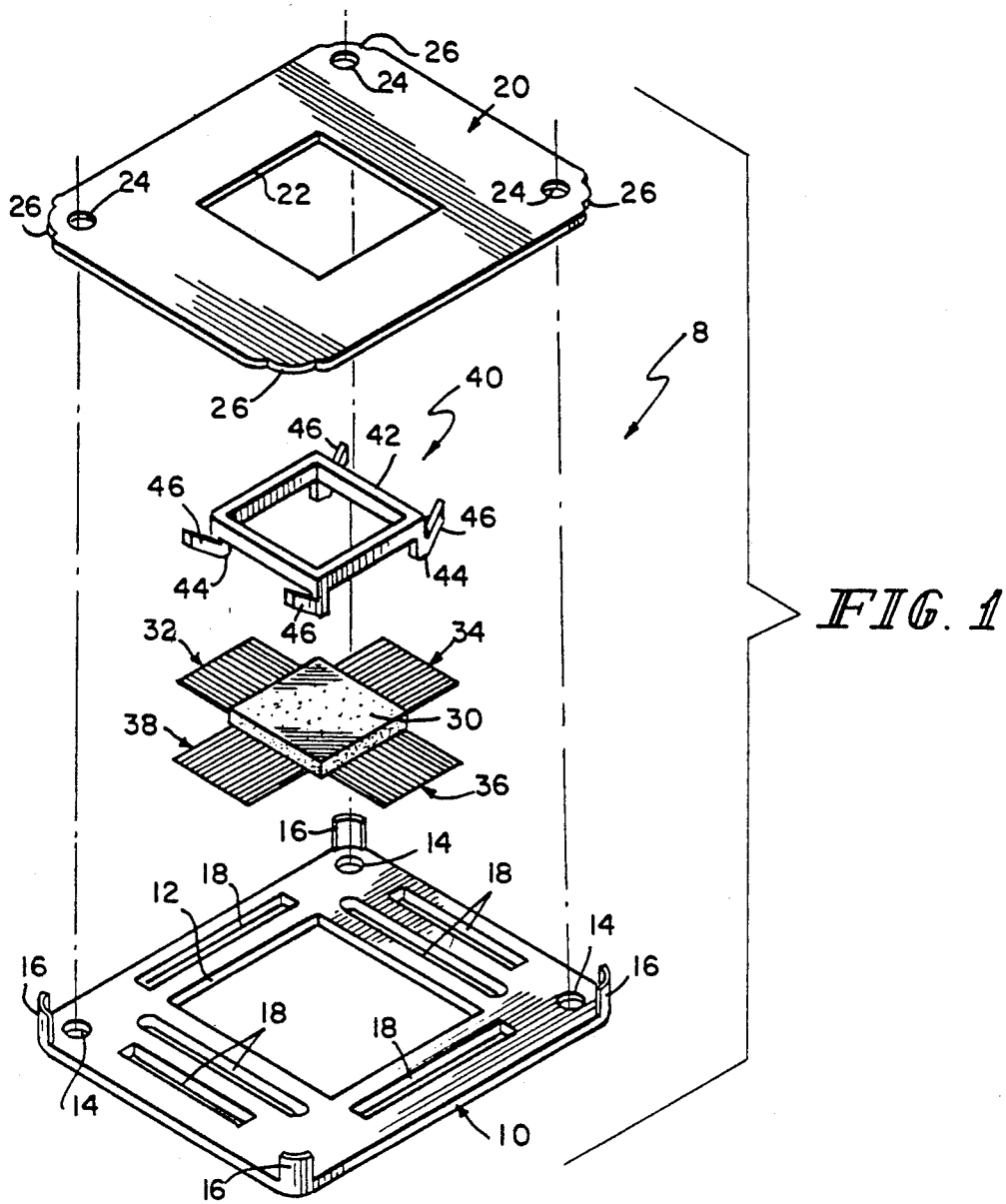
FIG. 1 is an exploded prospective view of a package assembly including the electrostatic discharge protection device of the present invention.

A package carrier assembly 8, as illustrated in exploded view of FIG. 1, includes a housing having a bottom element 10 and top element 20. A semiconductor package 30 and an electrostatic discharge protection device 40 are inserted between the bottom and top housing elements 10 and 20. The bottom housing element 10 includes a center opening 12, alignment openings 14, posts 16 and a plurality of openings 18 about the periphery of the center opening 12. The top 20 of the housing also includes a centered opening 22. Alignment openings 24 of the top 20 aligned with openings 14 in the bottom and scalloped edges 26 of the top are received at the post 16 of the bottom element. The bottom element 10 and top element 20 are pressfitted together. The three alignment pairs of openings 24 and 14 in the top 20 and the bottom 10 match three alignment posts or pins in the tester and assure appropriate orientation of the leads in the tester. Opening 18 allow access to the leads for testing. It will be more evident with respect to the discussion of the assembly and their use with respect to FIGS. 2 and 3, that the opening 12 is larger than the opening 22.

The semiconductor package 30 includes four sets of leads 32, 34, 36 and 38 extending from a respective side of the package 30. The package 30 is centered in the openings 12 and 22 which are larger than the package 30.

The electrostatic discharge protection device 40 includes lead shorting device 42, actuator 44 and biasing element 46. The lead shorting device 42, actuator 44 and the biasing element 46 forms a single unitary structure. The lead shorting device 42 includes four elements corresponding to the four sets of leads 32, 34, 36 and 38. Four actuators 44 extend from the corners of the lead shorting elements 42. Biasing elements 46 extend from the other end of the actuating elements 44 back towards the lead shorting elements 42.

Figure 2:
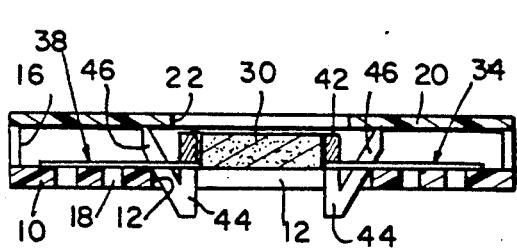
FIG. 2 is a cross-sectional view of the assembled package with the electrostatic discharge device in its engaged or shorting position.
Figure 3:
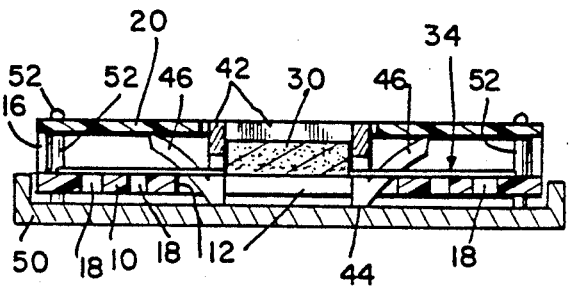
FIG. 3 is a cross-sectional view of the electrostatic discharge device in its disengaged or non-shorting position.

As illustrated in FIGS. 2 and 3, the shorting elements 42 are positioned in the opening 22 of the top 20 and engaged the leads of the semiconductor package 30 in FIG. 2 and are disengaged in FIG. 3. The actuators 44 extend into and through the opening 12 in the bottom plate 10 in FIG. 2 and extend into the opening 12 in FIG. 3. The biasing elements 46 extend from the inner surface of the top 20 and down into the opening 12 of the bottom 10. It should be noted that the spacing of the top 20 and bottom 10 has been exaggerated for sake of clarity.

When the package carrier assembly 8 is not mounted in a tester, the spring elements 46, engaging the inner surface of the top 20, biases the shorting elements 42 into engagements with the leads 32, 34, 36 and 38 as illustrated in FIG. 2. Once the package carrier assembly 8 is inserted into a tester or test socket 50 with pins 52 in openings 14, 24 as illustrated in FIG. 3, the ends of the actuator 44 engage the tester and forces the shorting elements 42 up off the leads against the biasing of the bias elements 46. As illustrated in FIG. 3, the shorting elements 42 rise up and into the opening 22 in the top housing portion 20. As will be noted, the dimension of the elements have been selected such that the shorting bars 42 do not extend above the top surface of the top housing element 20. If there is room in the tester, this need not be a limitation.

Upon removal of the carrier, the package carrier assembly 8 from the test socket 50, the actuators 44 become disengaged from the socket 50 and the biasing elements 46 flexed to resume their desired position and thereby extending the actuators 44 through the opening 12 of the bottom 10 and forces the shorting elements 42 into engagement with the leads of the semiconductor package 30. Thus, it can be seen that the unitary structure automatically disengages and engages the shorting leads upon its insertion and removal from the test socket after its insertion. This is a fully automatic device to provide EDS protection without depending upon any interaction by the test operator.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed:

1. In a package carrier assembly having a housing for receiving a semiconductor package with leads extending from the package and accessible for testing in said housing and an ESD protection means in said housing for engaging said leads and shorting them together, the improvement being said ESD protection means which comprises:
   unitary shorting means for shorting all of said leads together;
   biasing means for biasing said shorting means into engagement with said leads; and
   actuator means for automatic overcoming said biasing means and causing said shorting means to disengage said leads in response to said package carrier being mounted to a tester whereby said biasing means causes said shorting means to engage said leads in response to said package being removed from said tester.

2. A package carrier assembly according to claim 1, wherein said shorting means include a plurality of shorting elements, one for each set of leads extending from a respective side of said package.

3. A package carrier assembly according to claim 1, wherein said shorting means, said biasing means and said actuator means are a unitary structure.

4. A package carrier assembly according to claim 3, wherein said actuator means extends from said shorting means and into a first opening in a first wall of said housing.

5. A package carrier assembly according to claim 4, wherein said biasing means extends from an end of said actuator means to a second wall of said housing for biasing said actuator means to an extended position into said first opening and said shorting means onto said leads.

6. A package carrier assembly according to claim 5, wherein said second wall has a second opening through which said shorting means extends when disengaged from said leads.

7. A package carrier assembly according to claim 1, wherein said actuator means extends from said shorting means and into a first opening in a first wall of said housing.

8. A package carrier assembly according to claim 7, wherein said biasing means extends from an end of said actuator means to a second wall of said housing for biasing said actuator means to an extended position into said first opening and said shorting means onto said leads.

9. A package carrier assembly according to claim 8, wherein said second wall has a second opening through which said shorting means extends when disengaged from said leads.

10. A shorting device for use in a package carrier assembly for a semiconductor package having extending leads comprising:
    unitary shorting means for shorting all of said leads together;
    biasing means for biasing said shorting means into engagement with said leads; and
    actuator means for automatic overcoming said biasing means and causing said shorting means to disengage said leads in response to said package carrier being mounted to a tester whereby said biasing means causes said shorting means to engage said leads in response to said package being removed from said tester.

11. A shorting device according to claim 10, wherein said shorting means include a plurality of shorting elements, one for each set of leads extending from a respective side of said package.

12. A shorting device according to claim 10, wherein said biasing means and said actuator means are unitary with said shorting means.

13. A shorting device according to claim 10, wherein said actuator means extends from said shorting means and into a first opening in a first wall of said carrier.

14. A shorting device according to claim 10, wherein said actuating means extends down from said shorting means and said biasing means extends up from said actuating means.

15. In a package carrier assembly having a housing for receiving a semiconductor package with leads extending from the package and accessible for testing in said housing and an ESD protection means in said housing for engaging said leads and shorting them together, the improvement being said ESD protection means which comprises:
    shorting means for shorting said leads together;
    biasing means for biasing said shorting means into engagement with said leads;
    actuator means, extending from said shorting means and into a first opening in a first wall of said housing, for automatic overcoming said biasing means and causing said shorting means to disengage said leads in response to said package carrier being mounted to a tester whereby said biasing means causes said shorting means to engage said leads in response to said package being removed from said tester, and
    wherein said biasing means extends from said actuator means to a position displaced from said shorting means into contact with a second wall of said housing for biasing said actuator means to an extended position into said first opening and said shorting means onto said leads.

16. A package carrier assembly according to claim 15, wherein said biasing means and said actuator means are unitary with said shorting means.

17. A shorting device for use in a package carrier assembly for a semiconductor package having extending leads comprising:

shorting means for shorting said leads together;

biasing means for biasing said shorting means into engagement with said leads;

actuator means, extending down from said shorting means and into a first opening in a first wall of said carrier, for automatic overcoming said biasing means and causing said shorting means to disengage said leads in response to said package carrier being mounted to a tester whereby said biasing means causes said shorting means to engage said leads in response to said package being removed from said tester; and said biasing means extends up from said actuating means to a position displaced from said shorting means into contact with a second wall of said carrier for biasing said actuator means to an extended position into said first opening and said shorting means onto said leads.

* * * * *